United States Patent
Lee et al.

(10) Patent No.: US 6,926,071 B2
(45) Date of Patent: Aug. 9, 2005

(54) HEAT DISSIPATION DEVICE

(75) Inventors: Hsieh Kun Lee, Tu-Chen (TW); Cuijun Lu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/816,133

(22) Filed: Mar. 31, 2004

(65) Prior Publication Data

US 2004/0226691 A1 Nov. 18, 2004

(30) Foreign Application Priority Data

Apr. 25, 2003 (TW) ........................ 92206590 U

(51) Int. Cl.⁷ .................................................. H05K 7/20
(52) U.S. Cl. .................................... 165/80.3; 361/704
(58) Field of Search ............................. 165/80.3, 185; 361/704, 710; 174/16.3; 257/719, 722

(56) References Cited

U.S. PATENT DOCUMENTS

| | | | |
|---|---|---|---|
| 4,546,405 A | * 10/1985 | Hultmark et al. | ........... 361/718 |
| 5,299,090 A | 3/1994 | Brady et al. | |
| 5,351,748 A | * 10/1994 | Dagan | ........................ 165/80.3 |
| 5,369,301 A | 11/1994 | Hayashi et al. | |
| 5,737,187 A | 4/1998 | Nguyen et al. | |
| 5,781,411 A | * 7/1998 | Feenstra | ...................... 361/704 |
| 5,988,266 A | 11/1999 | Smith et al. | |
| 6,021,045 A | 2/2000 | Johnson | |
| 6,025,643 A | 2/2000 | Auger | |
| 6,134,783 A | * 10/2000 | Bargman et al. | ......... 29/890.03 |
| 6,343,016 B1 | 1/2002 | Lin | |
| 6,817,405 B2 | * 11/2004 | Kamath et al. | ............ 165/80.3 |

* cited by examiner

Primary Examiner—Allen J. Flanigan
(74) Attorney, Agent, or Firm—Wei Te Chung

(57) ABSTRACT

A heat dissipation device (10) includes a base (12) and a plurality of fins (14). Each fin includes a heat dissipating post (14) and a heat conducting tab (18). Each heat dissipating post is made by rolling up a metallic slice and thereby defines a through hole therein. Each heat conducting tab includes an engaging part (18a) attached on the base and a medial part (18b) extending from the corresponding heat dissipating post. The medial parts thermally connect the engaging parts and the heat dissipating posts, and mechanically separate the engaging parts from the heat dissipating posts; thereby the through holes are allowed to be exposed at opposite ends of the heat dissipating posts.

15 Claims, 3 Drawing Sheets

US 6,926,071 B2

HEAT DISSIPATION DEVICE

BACKGROUND OF THE INVENTION

1. Field of the Invention

The present invention relates to heat dissipation devices for removing heat from electronic components, and more particularly to a heat dissipation device combined by a base and a plurality of fins attached to the base.

2. Description of Prior Art

Conventional heat dissipation devices used for removing heat from electronic components are mostly formed by extrusion of metallic material. The heat dissipation device comprises a base, and a plurality of fins integrally extending from the base. The fins are relatively thick in comparison with distances defined between each two adjacent fins, due to inherent limitations in extrusion technology This restricts the number of the fins that can be formed, and a total heat dissipation area that can be provided by the fins. Furthermore, a height of the fins is limited to about 13 times the distance between each two adjacent fins, also due to inherent limitations in extrusion technology.

With the continuing boom in electronics technology, numerous modem electronic components such as central processing units (CPUs) of computers can operate at very high speeds and thus generate large amounts of heat. The heat must be efficiently removed from the CPU; otherwise, abnormal operation or damage may result. Conventional extruded heat dissipation devices are increasingly no longer able to adequately remove heat from these contemporary electronic components.

In order to keep pace with these developments in electronics technology, assembled heat dissipation devices have been gaining in popularity. For example, Taiwan Patent No. 319406 provides an assembled heat dissipation device 40 (shown in FIG. 3) having a base 48 for contacting the CPU and a plurality of individual cylindrical fins 42 uniformly arranged on the base 48. Each fin 42 is formed by extrusion and comprises an axile hole 42a therein. An end 42b of the fin is engaged within a slot 46 defined in the base 48.

This kind of heat dissipation device 40 has a larger heat dissipating area due to the holes 42a in the fins 42. However, the heat dissipation device 40 has at least two disadvantages as follows. First, the fins 42 are relatively thin so that a mold for manufacturing the fins 42 is difficult to be made. Second, the fins 42 are lodged within the slots 46 of the base 48 which is in contact with the CPU. It is very known that each hole 42a is sealed at an end in the base 48. Thus, dissipation of the heat in the holes 42a merely relies on conduction and radiation, especially on conduction. This design has less help to prompt heat dissipating capability. The heat removal efficiency of the heat dissipation device is still low relative to the requirement of the contemporary electronic components.

SUMMARY OF THE INVENTION

Accordingly, an object of the present invention is to provide a heat dissipation device having a great heat dissipation efficiency.

In order to achieve the objects set out above, a heat dissipation device in accordance with a preferred embodiment of the present invention comprises a base and a plurality of individual fins. Each fin comprises a heat dissipating post and a heat conducting tab. Each heat dissipating post is made by rolling up a metallic slice and thereby defines a through hole therein. Each heat conducting tab comprises an engaging part attached on the base and a medial part extending from the corresponding heat dissipating post. The medial parts thermally connect the engaging parts and the heat dissipating posts, and mechanically separate the engaging parts from the heat dissipating posts; thereby the through holes are allowed to be exposed at opposite ends of the heat dissipating posts.

Other objects, advantages and novel features of the present invention will become more apparent from the following detailed description when taken in conjunction with the accompanying drawings, in which:

DETAILED DESCRIPTION OF THE INVENTION

Figure 1:
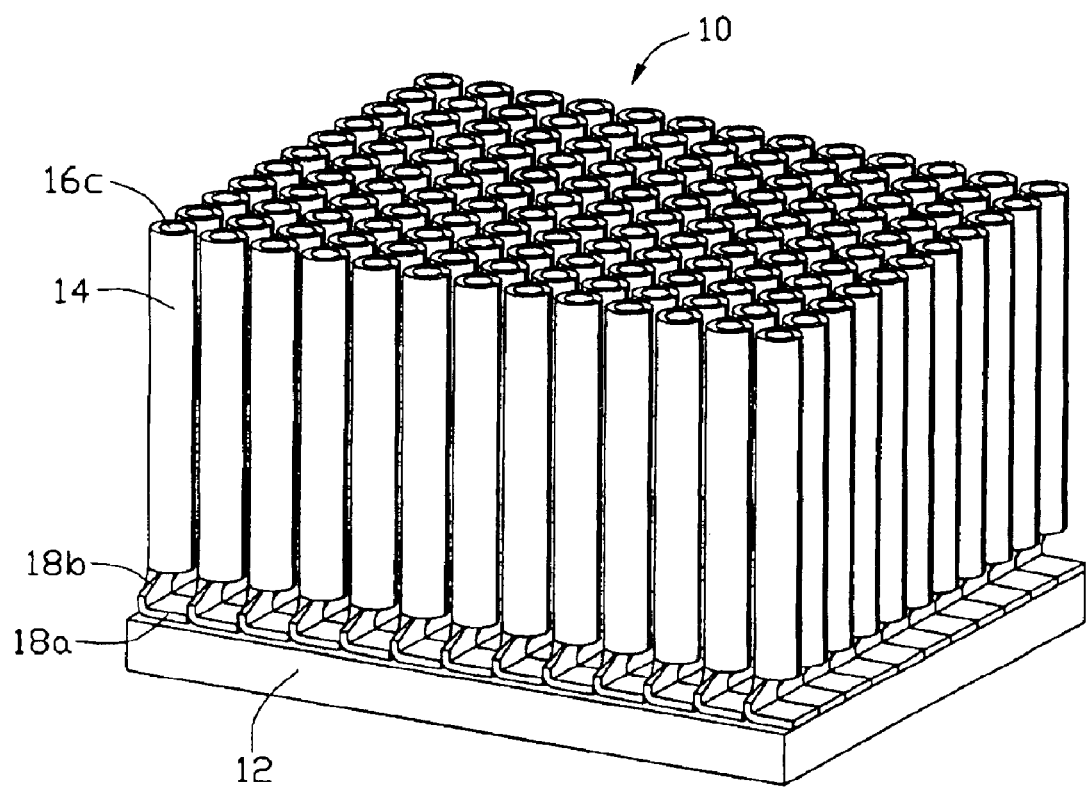
FIG. 1 is an isometric view of a heat dissipation device in accordance with the preferred embodiment of the present invention.
Figure 2:
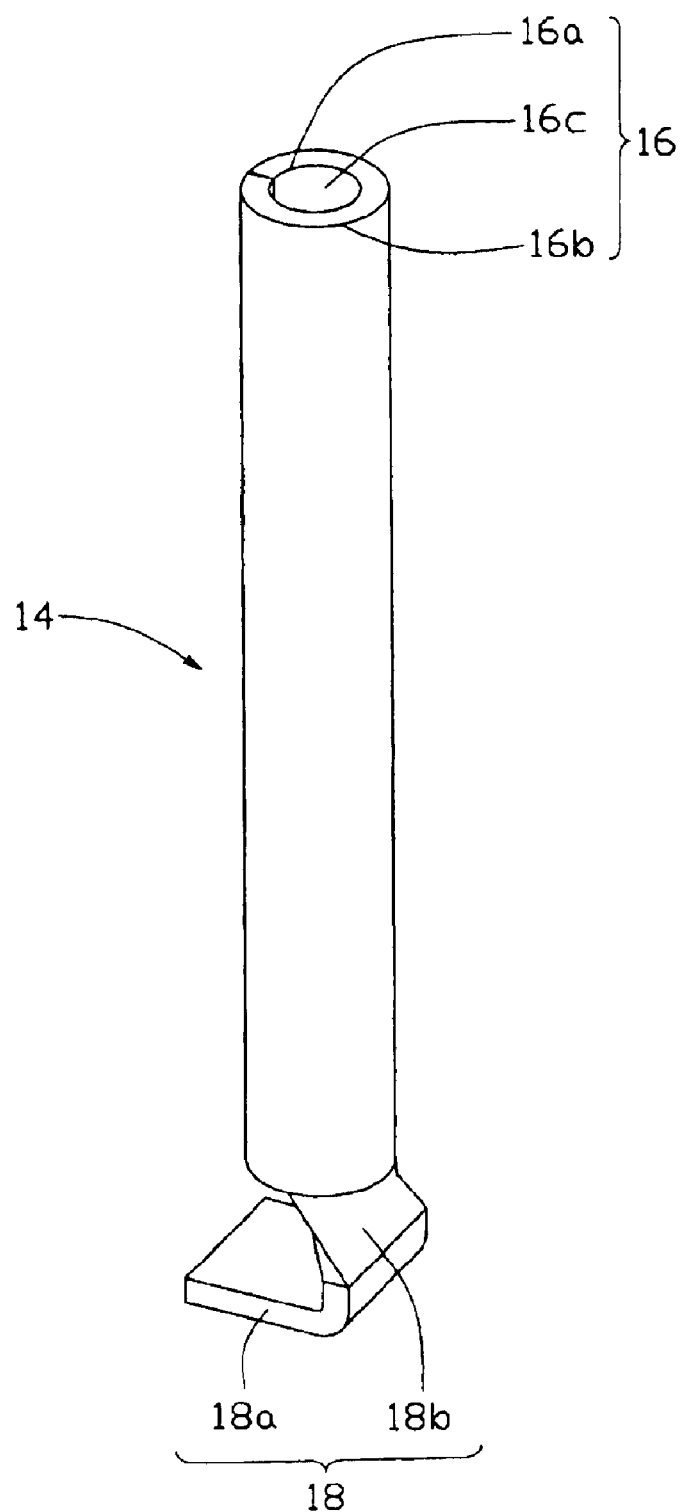
FIG. 2 is an isometric view of a fin of the heat dissipation device of FIG. 1.
Figure 3:
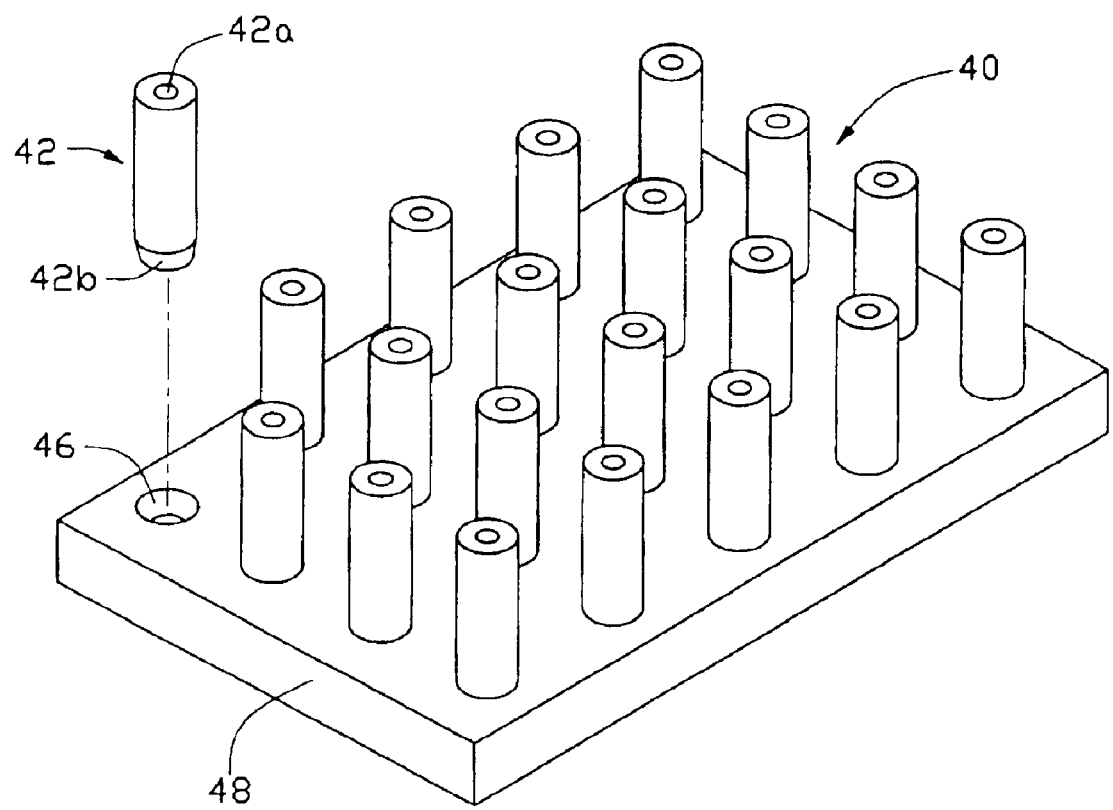
FIG. 3 is an isometric view of a conventional heat dissipation device.

Referring to FIGS. 1–2, a heat dissipation device 10 in accordance with the preferred embodiment of the present invention comprises a base 12 for contacting an electronic component (not shown), and a plurality of individual fins 14. The base 12 is for removing heat from the electronic component. The fins 14 are attached to the base 12. In the preferred embodiment, the base 12 is flat.

Each fin 14 is made from a metallic slice. Each fin 14 comprises a heat dissipating post 16 rolling up from a main body of the metallic slice and a heat conducting portion 18 extending from the main body of the metallic slice. The heat dissipating post 16 is substantially a hollow post and comprises a first heat dissipating surface 16a and a second heat dissipating surface 16b, and further defines an axile through hole 16c by the first heat dissipating surface 16a. The heat conducting tab 18 comprises an engaging part 18a for engaging with the base 12 and a medial part 18b integrally extends from an end of the heat dissipating post 16 for thermally connecting the engaging part 18a and the heat dissipating post 16 and for separating the engaging part 18a from the heat dissipating post 16. The fin 14 narrows at the heat conducting tab 18. In the preferred embodiment, the engaging part 18a is perpendicular to the medial part 18b and the heat dissipating post 16, in other words, each fin 14 has a substantially L-shaped profile. The engaging part 18a is flat in accordance with the shape of the base 12 and has a contact surface with the base 12 larger than a cross-sectional area of the heat dissipating post 16.

In assembly of the heat dissipation device 10, all fins 14 are attached on a surface of the base 12 for removing heat from the base 12 to the heat dissipating posts 16. The heat dissipating posts 16 of the fins 14 are spaced from each other. The through holes 16c are exposed at opposite ends of the heat dissipating post 16, due to the separation of the heat dissipating posts 16 from the engaging parts 18a by the medial parts 18b which are narrow relative to the heat dissipating posts 16.

In the present invention, the fins 14 are made by rolling up metallic slices; thus, the first heat dissipating surfaces 16a each have a larger area than that provided in Taiwan Patent No. 319406. The heat conducting tab 18 permits the through holes 16c to be exposed at opposite ends of the heat dissipating posts 16; thus, air convection can be utilized in the heat dissipation device 10 to enhancing heat dissipation efficiency of the first heat dissipating surface 16a.

In the present invention, the fins 14 can have any reasonable shape. The engaging parts 18a can be attached to the base 12 by soldering, pressing or any other suitable means. A fan (not shown) can be mounted on the fins 14 to enhancing air convection.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:

a base; and a heat dissipating member defining through holes therein; and a heat conducting member thermally connecting the heat dissipating member and the base, and mechanically spacing the heat dissipating member from the base, wherein the heat dissipating member comprises a plurality of heat dissipating posts, each heat dissipating post defines one of said through holes; and wherein each of the posts is made by rolling up a metallic slice.

2. The heat dissipation device of claim 1, wherein the heat conducting member comprises a plurality of heat conducting tabs respectively extending from the heat dissipating posts.

3. The heat dissipation device of claim 2, wherein each of the heat conducting tab comprises a medial part extending from a corresponding heat conducting post and mechanically separating said heat conducting post from the base.

4. The heat dissipation device of claim 3, wherein each of the heat conducting tab comprises an engaging part extending perpendicularly from the medial part and attached on the base, the engaging parts removing heat from the base to the heat dissipating posts.

5. A heat dissipation device comprising:

a base;

a plurality of tubular fins located above said base;

a plurality of conductive members located between the tubular fins and the base, respectively, to not only support said tubular fins in position but also transfer heat from the base to the fins; wherein two opposite ends of each of said tubular fins are exposed to an exterior for enhancement of heat dissipation, wherein each of said conductive members includes a planar engaging part attached to the base and a medial part spacing the corresponding tubular fin from the engaging, part; and wherein either the engaging parts of the conductive members or the tubular fins are engaged with one another horizontally.

6. The heat dissipation device of claim 5, wherein said conductive members are integrally formed with the corresponding tubular fins, respectively.

7. The heat dissipation device of claim 5, wherein said plurality of tubular fins are parallel with one another.

8. The heat dissipation device of claim 5, wherein said tubular fins are perpendicular to the base.

9. The heat dissipation device of claim 5, wherein said tubular fins are densely arranged above the base.

10. A heat dissipation device comprising:

a base; and a plurality of individual fins, each of the fins integrally comprising:

an engaging part attached to the base; and a hollow post spaced from the engaging part and comprising an inlet and an outlet at opposite ends thereof, one of the inlet and the outlet pointing to the base.

11. The heat dissipation device of claim 10, wherein each of the fins has a substantially L-shaped profile.

12. The heat dissipation device of claim 11, wherein the engaging part has a contact surface with the base larger than a cross-sectional area of the post.

13. The heat dissipation device of claim 10, wherein said one of the inlet and the outlet faces the engaging part.

14. The heat dissipation device of claim 10, wherein the fins are perpendicular to the base.

15. The heat dissipation device of claim 10, wherein each of said hollow posts defines a through hole extending therethrough in an axial direction and exposed to an exterior in said axial direction at said opposite ends, respectively.

* * * * *